United States Patent
An et al.

(10) Patent No.: US 7,638,787 B2
(45) Date of Patent: Dec. 29, 2009

(54) PHASE CHANGEABLE MEMORY CELL ARRAY REGION AND METHOD OF FORMING THE SAME

(75) Inventors: Hyeong-Geun An, Suwon-si (KR); Hideki Horii, Seoul (KR); Sang-Yeol Kang, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 284 days.

(21) Appl. No.: 11/581,012

(22) Filed: Oct. 16, 2006

(65) Prior Publication Data

US 2007/0111440 A1 May 17, 2007

(30) Foreign Application Priority Data

Nov. 14, 2005 (KR) ...................... 10-2005-0108797

(51) Int. Cl.
*H01L 29/02* (2006.01)
*G11C 11/00* (2006.01)

(52) U.S. Cl. ........................... 257/2; 257/529; 257/537; 257/E31.029; 257/E31.03; 365/148; 365/163

(58) Field of Classification Search ................ 257/2, 257/529, 537, E31.029, E31.03; 365/148, 365/163
See application file for complete search history.

(56) References Cited

U.S. PATENT DOCUMENTS 6,972,429 B1 * 12/2005 Hsueh et al. .................. 257/3

2004/0042265 A1 * 3/2004 Moore et al. ................ 365/163
2005/0127347 A1 * 6/2005 Choi et al. ....................... 257/2
2007/0034905 A1 * 2/2007 Elkins ......................... 257/211

FOREIGN PATENT DOCUMENTS

| JP | 2003-249626 | 9/2003 |
|---|---|---|
| JP | 2004-349504 | 12/2004 |
| KR | 1020040100867 A | 12/2004 |
| KR | 1020040104834 A | 12/2004 |

* cited by examiner

*Primary Examiner*—Ha Tran T Nguyen
*Assistant Examiner*—Karen M Kusumakar
(74) *Attorney, Agent, or Firm*—Volentine & Whitt, PLLC (57) ABSTRACT

A phase changeable memory cell array region includes a lower interlayer insulating layer disposed on a semiconductor substrate. The region also includes a plurality of conductive plugs disposed through the lower interlayer insulating layer. The region also includes a phase changeable material pattern operably disposed on the lower interlayer insulating layer, the phase changeable pattern covering at least two of the plurality of conductive plugs, wherein the phase changeable material pattern includes a plurality of first regions in contact with one or more of the plurality of conductive plugs and at least one second region interposed between the plurality of the first regions, wherein the at least one second region has a lower thermal conductivity than the plurality of first regions. The phase changeable memory cell array region also includes an upper interlayer insulating layer covering at least one of the phase changeable material pattern and the lower interlayer insulating layer. The region also includes conductive patterns disposed through the upper interlayer insulating layer and electrically connected to a plurality of predetermined regions of the plurality of first regions.

3 Claims, 10 Drawing Sheets

PHASE CHANGEABLE MEMORY CELL ARRAY REGION AND METHOD OF FORMING THE SAME

BACKGROUND OF THE INVENTION

1. Field of the Invention

The present invention generally relates to semiconductor devices and a method of fabricating the same and, more particularly, to a phase changeable memory cell array region and methods of forming the same.

A claim of priority is made to Korean Patent Application No. 10-2005-0108797, filed Nov. 14, 2005, the entirety of which is incorporated by reference.

2. Description of Related Art

Nonvolatile memory devices do not lose stored data even in the event of an abrupt loss of power supply. For at least this reason, nonvolatile memory devices are widely used in computers, mobile telecommunication systems, memory cards, and other such applications.

Various types of nonvolatile memory devices may be used in electronic equipment. For example, a flash memory device is a widely used type of a nonvolatile memory device. A flash memory device is configured to store memory even in the event of an abrupt loss of power. Typically, the flash memory device includes memory cells with stacked gate structures. The stacked gate structures include a number of components. In particular, the stacked gate structure includes a tunnel oxide layer, a floating gate, an inter-gate dielectric layer, and a control gate electrode, which are sequentially stacked on a channel region. In addition, the stacked gate structure may include other components that may be used to store data.

Various techniques may be used to improve the working of the flash memory device. For example, in order to improve the reliability and programming efficiency of the memory cells of the flash memory device, the film quality of the tunnel oxide layer may be improved and the coupling ratio of the memory cells may be increased.

While flash memory devices are extensively used in various applications, efforts have been made to introduce new nonvolatile memory devices in the market. One such nonvolatile memory device is a phase changeable memory device. A phase changeable memory device includes a number of components. For example, a unit cell of the phase changeable memory device includes a switching device. The unit cell also includes a data storage element that is connected in series to the switching device. The data storage element includes a lower electrode electrically connected to the switching device, a phase changeable material pattern disposed on the lower electrode, and an upper electrode disposed on the phase changeable material pattern. In general, the lower electrode functions as a heater. Specifically, when a write current flows through the switching device and the lower electrode, heat is generated at an interfacial surface between the phase changeable material pattern and the lower electrode. The generated heat changes the phase changeable material pattern into an amorphous or crystalline state.

Conventionally, a phase changeable material layer of the phase changeable memory device is shaped as an island which is separately disposed in each memory cell. The phase changeable material layer may be shaped as an island using a number of processes. For example, an etching process may be performed to form the phase changeable material layer in the island shape.

The use of an etching process may cause undesirable changes in the phase changeable material. For example, the properties of a separated surface of the phase changeable material layer may change due to the etching process. Furthermore, the separated surface of the phase changeable material layer may come into contact with, for example, an interlayer dielectric layer. This contact between the phase changeable material and the interlayer dielectric layer may change the composition of the phase changeable material. Because of the undesirable changes in the phase changeable material, the amount of normal phase changeable region available for programming is reduced. This reduction in the amount of phase changeable region available for programming may affect the functionality of the phase changeable memory cell.

Furthermore, even if a phase changeable memory device is programmed initially, a portion exposed by the separated surface of the phase changeable material layer may deteriorate over a period of time. This deterioration may reduce the number of times that the phase changeable memory device can be re-written to.

Numerous efforts have been directed towards preventing the above-mentioned problems from surfacing in phase changeable memory devices. For example, Korean Laid-open Publication No. 10-2004-0100867 for "Semiconductor Integrated Circuit Device" by Takaura, Norikatsu et al. ("Norikatsu") discloses a method of preventing degradation of the properties of the phase changeable memory cell during the etching process of the phase changeable material layer. According to Norikatsu, when a cell size is reduced to increase the integration density of a semiconductor device, a common memory cell upper plate electrode that is connected to a power line, is formed on a phase changeable material layer in a memory cell region. The memory cell region also includes a resistor device for a phase changeable memory. Furthermore, the phase changeable material layer is shared between the resistor device and the electrode. Thus, the phase changeable material layer is not exposed except for a memory cell positioned at the outermost circumferential portion of a memory cell region.

Because a major portion of the phase changeable material is not exposed, neither the shape of the memory cell nor the composition of the phase changeable material layer is affected by an etching process. Therefore, despite the use of the etching process to shape the phase changeable material layer, the electrical properties of the memory cell formed by the method of Norikatsu may be uniform. The uniform electrical properties of the memory cell may improve the reliability of the memory cell.

While the Norikatsu memory cell may have improved reliability, it has several shortcomings. For example, the phase changeable material layer in the phase changeable memory cell of Norikatsu may cause thermal disturbance between adjacent memory cells. Furthermore, when a distance between the memory cells decreases with an increase in the integration density of semiconductor devices, the thermal disturbance may increase. For example, when a memory cell A is in a low resistive state (i.e., a "0" state) and a memory cell B adjacent to the memory cell A is in a high resistive state (i.e., a "1" state), heat generated at an interfacial surface between a lower electrode of the memory cell B and the phase changeable material layer in memory cell B may melt the phase changeable material layer in memory cell B. In this case, because the phase changeable material layer in the memory cell A is connected to the phase changeable material layer in the adjacent memory cell B, the phase changeable material layer transmits heat from the memory cell B to the memory cell A. This heat transfer from memory cell B to memory cell A may cause the temperature of the memory cell A to increase. The increase in temperature of memory cell A may cause, memory cell A to transition from the low resistive state (i.e., the "0" state) to a higher resistive state. As a result, the memory cell A may lose specific data corresponding to the "0" state and may therefore not function as a memory cell any more.

The present disclosure is directed towards coming one or more problems associated with the prior art phase changeable memory devices.

SUMMARY OF THE INVENTION

One aspect of the present disclosure includes a phase changeable memory cell array region. The phase changeable memory cell array region includes a lower interlayer insulating layer disposed on a semiconductor substrate. The region also includes a plurality of conductive plugs disposed through the lower interlayer insulating layer. The region also includes a phase changeable material pattern operably disposed on the lower interlayer insulating layer, the phase changeable pattern covering at least two of the plurality of conductive plugs, wherein the phase changeable material pattern includes a plurality of first regions in contact with one or more of the plurality of conductive plugs and at least one second region interposed between the plurality of the first regions, wherein the at least one second region has a lower thermal conductivity than the plurality of first regions. The phase changeable memory cell array region also includes an upper interlayer insulating layer covering at least one of the phase changeable material pattern and the lower interlayer insulating layer. The region also includes conductive patterns disposed through the upper interlayer insulating layer and electrically connected to a plurality of predetermined regions in the plurality of first regions.

Another aspect of the present disclosure includes a method of forming a phase changeable memory cell array region. The method includes forming a lower interlayer insulating layer on a semiconductor substrate. The method also includes forming a plurality of conductive plugs through the lower interlayer insulating layer. The method also includes forming a phase changeable material pattern on the lower interlayer insulating layer, the phase changeable material pattern covering at least two of the plurality conductive plugs, wherein the phase changeable material pattern includes a plurality of first regions in contact with one or more of the plurality of conductive plugs and at least one second region interposed between the plurality of the first regions, wherein the at least one second region has a lower thermal conductivity than the plurality of first regions. The method also includes forming an upper interlayer insulating layer covering at least one of the phase changeable material pattern and the lower interlayer insulating layer. The method also includes forming conductive patterns through the upper interlayer insulating layer and electrically connecting the conductive patterns to a plurality of predetermined regions in the plurality of first regions.

BRIEF DESCRIPTION OF THE DRAWINGS

The foregoing and other features of the invention will become readily apparent from the detailed description that follows, with reference to the accompanying drawings. The drawings are not necessarily to scale, emphasis instead being placed upon illustrating the principles of the invention.

DETAILED DESCRIPTION OF EMBODIMENTS

The present invention will now be described more fully hereinafter with reference to the accompanying drawings, in which exemplary embodiments of the invention are shown. This invention may, however, be embodied in different forms and should not be construed as limited to the embodiments set forth herein. Rather, these embodiments are provided so that this disclosure is thorough and complete and fully conveys the scope of the invention to those skilled in the art. In the drawings, the thicknesses of layers and regions are exaggerated for clarity. The same reference numerals are used to denote the same elements.

Figure 1:
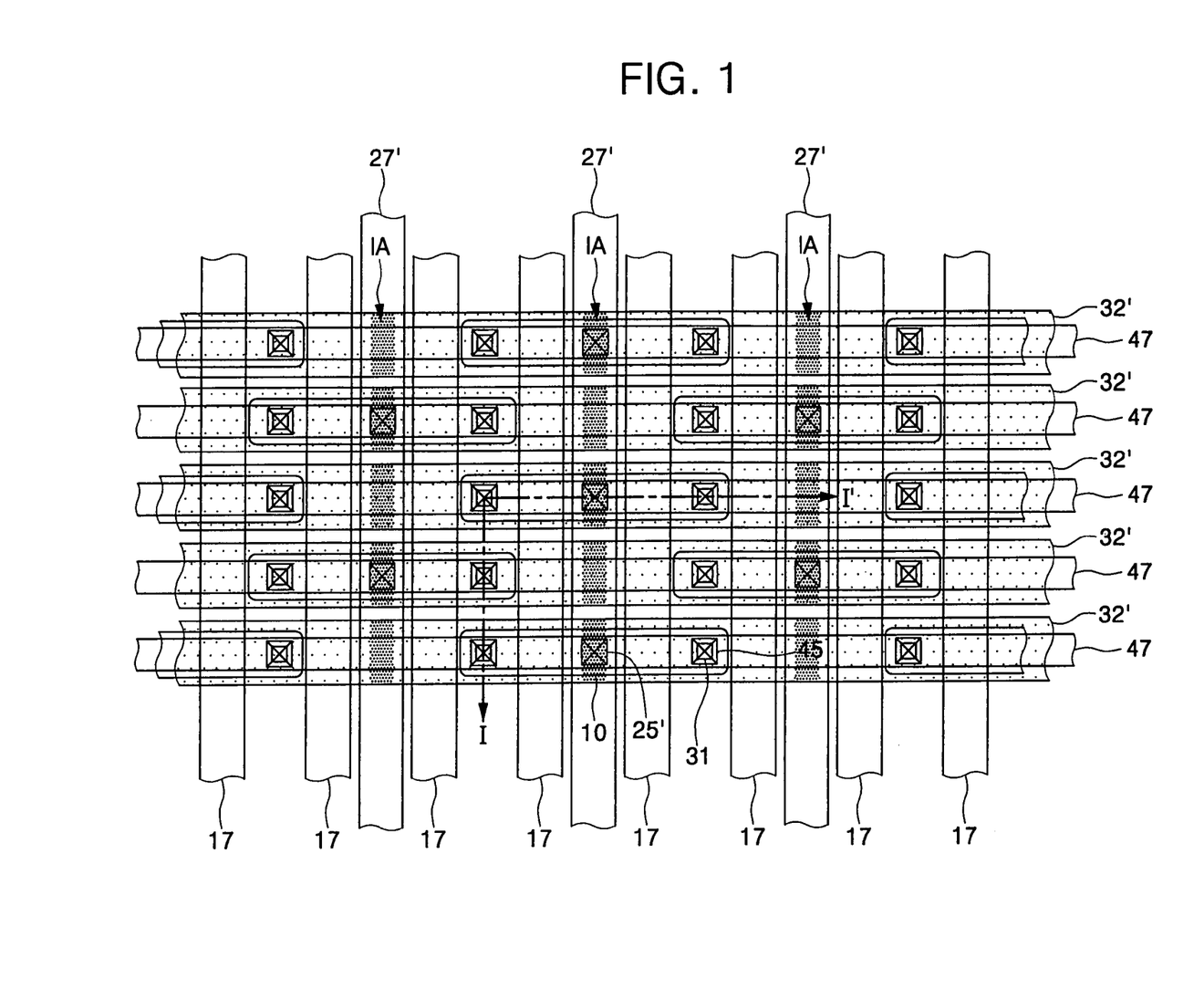
FIG. 1 is a plan view illustrating a method of forming a phase changeable memory cell array region according to an exemplary disclosed embodiment.

FIG. 1 is a plan view illustrating a method of forming a phase changeable memory cell array region according to an exemplary embodiment of the present invention, and FIGS. 2A through 2F are vertical cross-sectional views taken along line I-I' of FIG. 1.

Figure 2A:
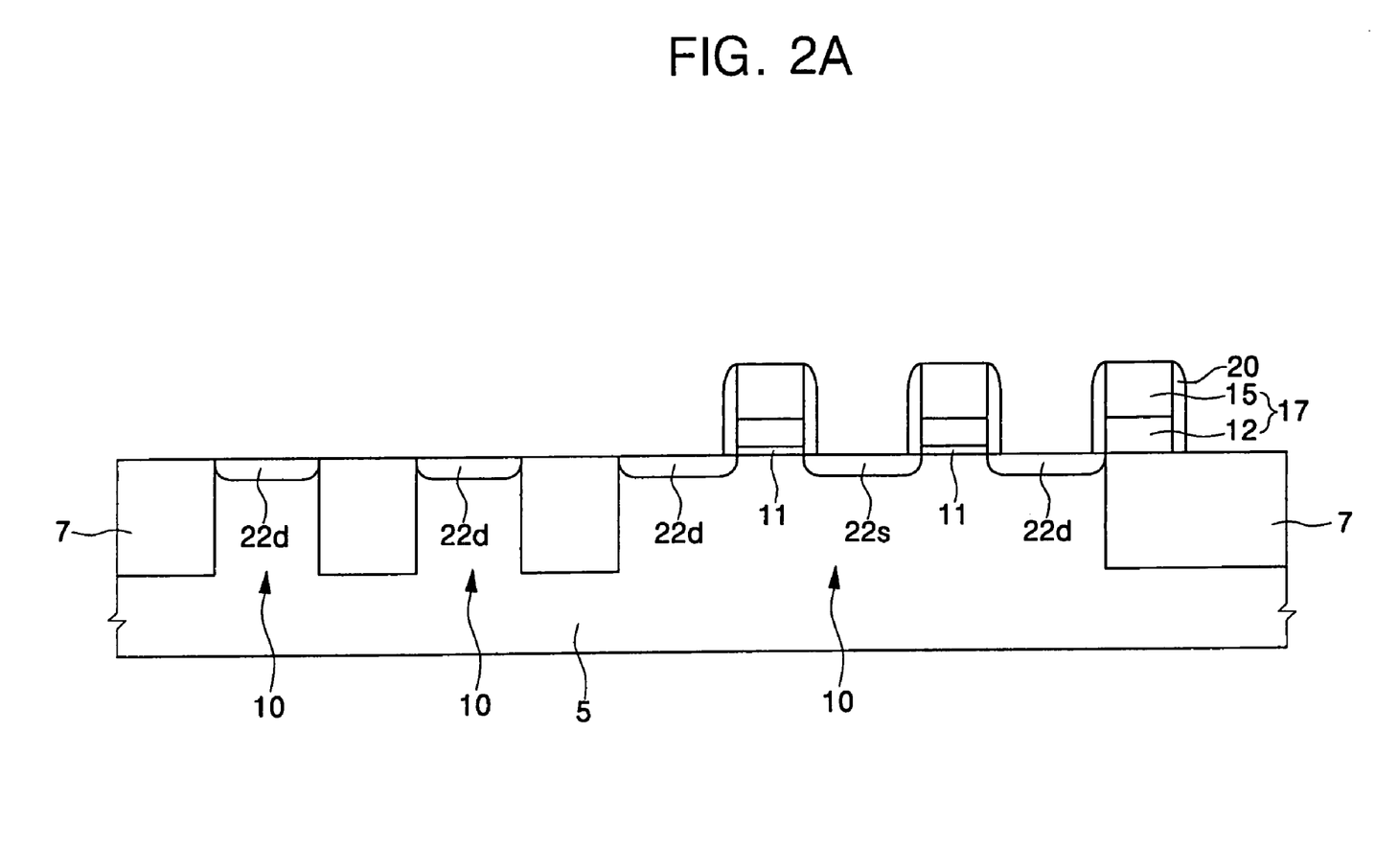
FIGS. 2A through 2F are vertical cross-sectional views taken along line I-I' of FIG. 1.

Referring to FIGS. 1 and 2A, the method of forming a phase changeable memory cell array includes forming an isolation layer 7 in a predetermined region of a semiconductor substrate 5. The isolation layer 7 defines active regions 10. In addition, a gate insulating layer 11 is formed on the active regions 10. Furthermore, a gate conductive layer is formed on the semiconductor substrate 5 that includes the gate insulating layer 11. Specifically, the gate conductive layer may be formed by sequentially depositing a polysilicon layer and a metal silicide layer. In addition, the gate conductive layer is patterned to form parallel gate electrodes 17 crossing over the active regions 10. As a result, each of the gate electrodes 17 may include a polysilicon pattern 12 and a metal silicide pattern 15, which are sequentially stacked. In an exemplary embodiment, the gate insulating layer 11 may be patterned at the same time with the gate conductive layer. Furthermore, the gate electrodes 17 may extend and function as word lines 17.

The method also includes the formation of switching devices. The switching devices may include the gate electrodes 17 and source and drain regions. In particular, the method includes implanting impurity ions into the active regions 10 by using the gate electrodes 17 and the isolation layer 7 as ion implantation masks. The implanted impurity ions are used to form common source regions 22s and drain regions 22d. Thereafter, gate spacers 20 may be formed to cover sidewalls of the gate electrodes 17. The gate electrodes 17, the common source regions 22s, and the drain regions 22d may constitute switching devices (i.e., access MOS transistors. Furthermore, the switching devices may have the structure of bipolar transistors.

In addition to the formation of switching devices, the method also includes the formation of interlayer insulating layers and a conductive layer on the semiconductor substrate 5. Specifically, referring to FIGS. 1 and 2B, a first lower interlayer insulating layer 24 is formed on the semiconductor substrate 5 having the switching devices. The first lower interlayer insulating layer 24 is patterned, thereby forming common source contact holes and drain contact holes which expose the common source regions 22s and the drain regions 22d, respectively. In addition, common source contact plugs 25' and drain contact plugs 25 are formed in the common source contact holes and the drain contact holes, respectively, using any method known to one skilled in the art.

Figure 2B:
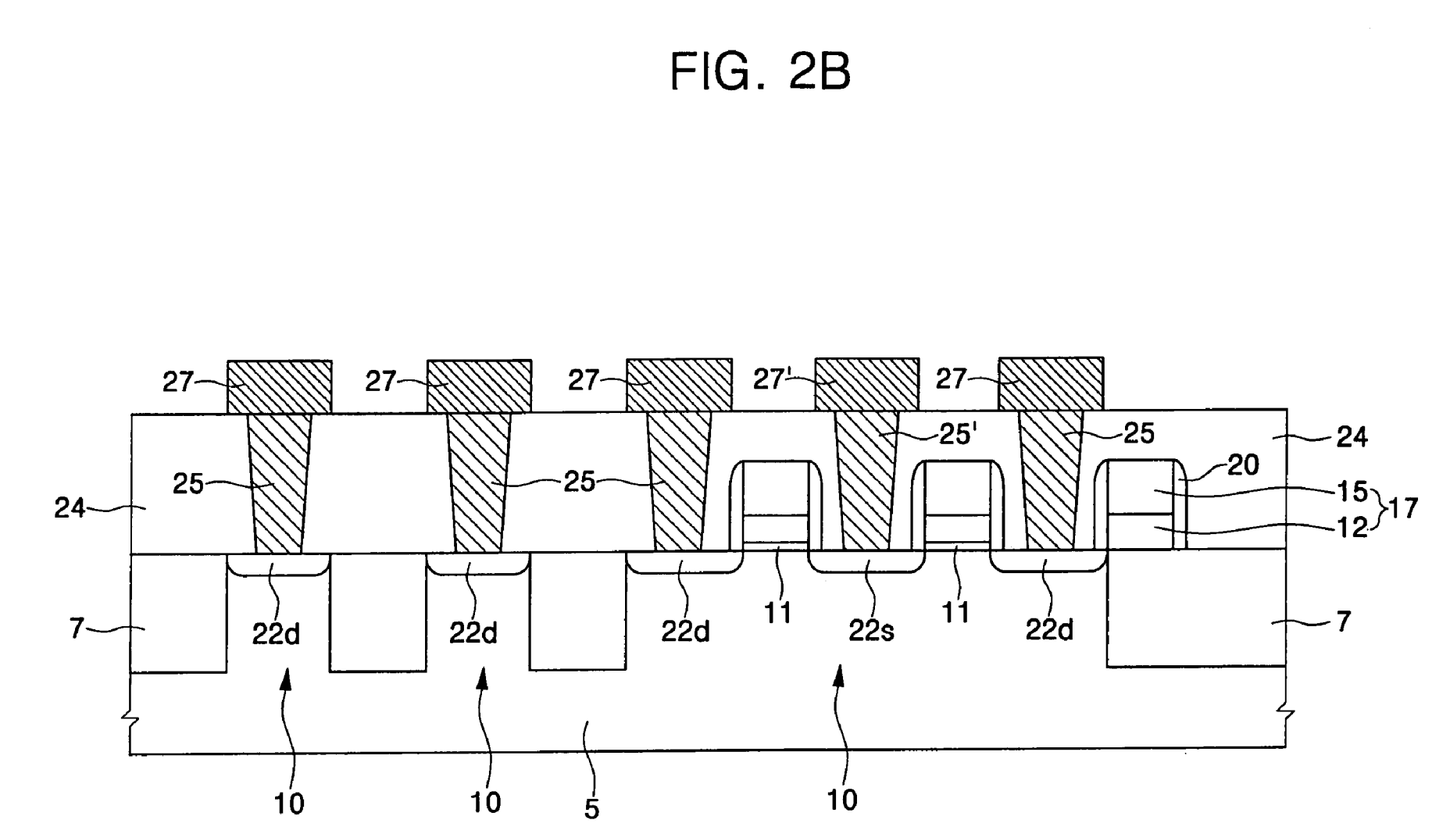

A conductive layer is formed on the semiconductor substrate 5 having the contact plugs 25 and 25'. The conductive layer is patterned, thereby forming first interconnections 27' and drain pads 27. The first interconnections 27' cover the common source contact plugs 25' and the drain pads 27 cover the drain contact plugs 25. In an exemplary embodiment, the first interconnections 27' may be formed parallel to the word lines 17. Alternatively, the first interconnections 27' may be formed to cross over the word lines 17. In addition, the first interconnections 27' may be connected to a ground. Alternatively, the first interconnections 27' may function as bit lines.

Figure 2C:
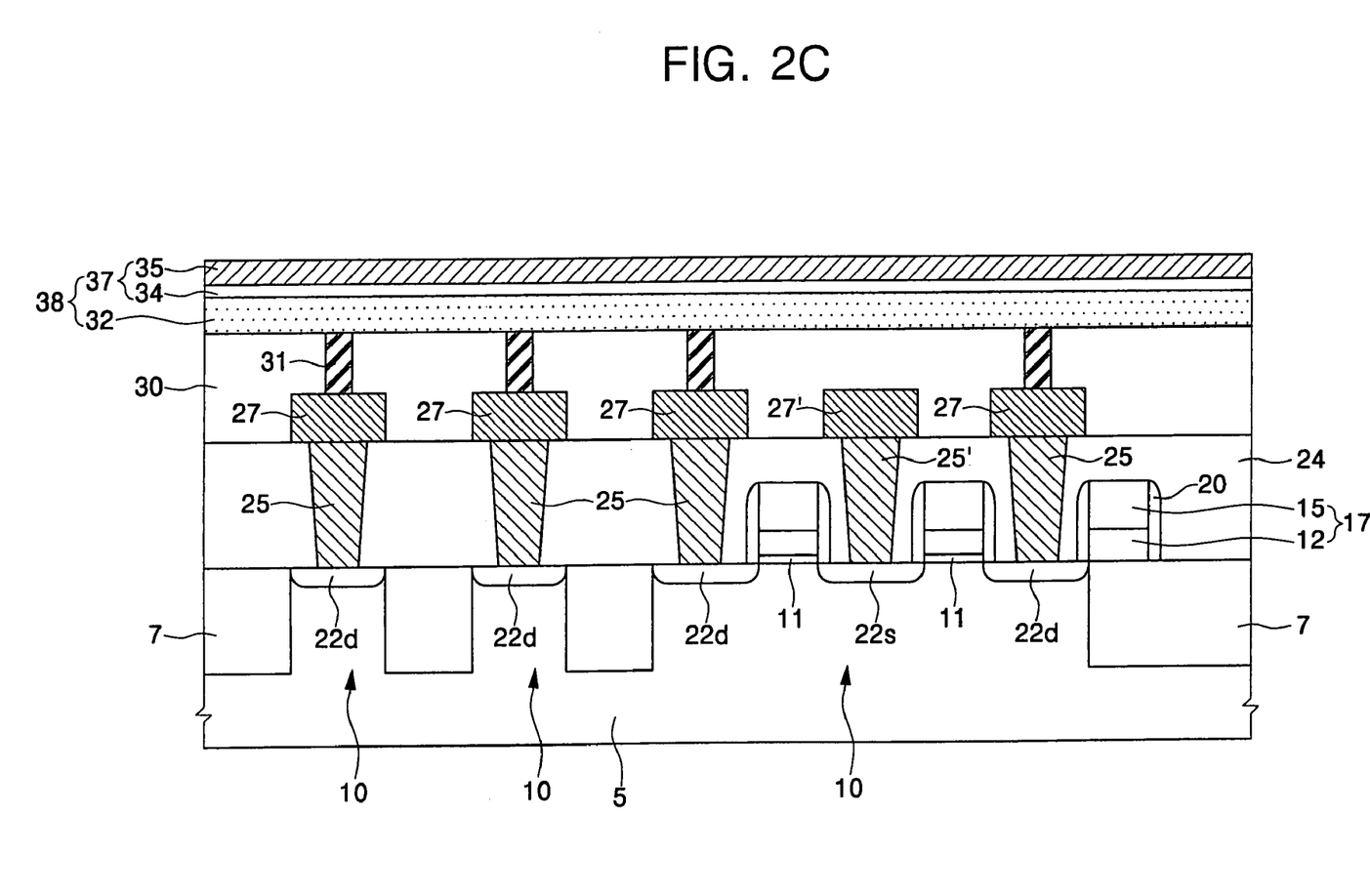

The phase changeable memory cell array also includes a second lower interlayer insulating layer. Referring to FIGS. 1 and 2C, a second lower interlayer insulating layer 30 is formed on the semiconductor substrate 5 that includes the first interconnections 27' and the drain pads 27. The second lower interlayer insulating layer 30 is patterned to form storage node contact holes which expose the drain pads 27. In addition, the storage node contact holes include lower conductive plugs 31. In an exemplary embodiment, the first and second lower interlayer insulating layers 24 and 30 constitute a lower interlayer insulating layer.

In addition to the lower interlayer insulating layer, the phase changeable memory cell array includes a phase changeable material layer 32. In particular, the phase changeable material layer 32 is formed on the semiconductor substrate 5 that includes the lower conductive plugs 31. The phase changeable material layer 32 may be a material layer containing at least one of chalcogenide elements, such as Te and Se. For example, the phase changeable material layer 32 may be a chalcogenide layer, such as a GST($Ge_2Sb_2Te_5$) layer. When the phase changeable material layer 32 is the GST layer, the GST layer may be formed by a sputtering or chemical vapor deposition (CVD) process. In an exemplary embodiment, the sputtering or CVD process may be performed using nitrogen gas as a reactive gas so that the GST layer may contain nitrogen with a concentration of less than 5%.

The phase changeable material layer 32 may be formed to have a crystalline structure. In particular, the GST layer including nitrogen with a concentration of less than 5% may be formed to have a crystalline structure. Accordingly, after a device is formed, all memory cells may be in a low resistive state (i.e., a "0" state). In an exemplary embodiment, the GST layer containing nitrogen with a concentration of less than 5% has a larger difference in resistance between the "0" state and a "1" state than a GST layer not containing nitrogen at all.

The lower conductive plugs 31 are in direct contact with the phase changeable material layer 32. Therefore, the lower conductive plugs 31 may be formed of a conductive layer that does not react with the phase changeable material layer 32. For example, the lower conductive plugs 31 may be formed of a TiN or TiAlN layer. An upper electrode layer 37 may be formed on the phase changeable material layer 32. Like the lower conductive plugs 31, the upper electrode layer 37 may also be formed of a conductive layer that does not react with the phase changeable material layer 32. In addition, the upper electrode layer 37 may be formed by sequentially stacking an interface layer 14 and a metal nitride layer 35. For example, the upper electrode layer 37 may be formed by sequentially stacking a Ti layer and a TiN layer. The phase changeable material layer 32 and the upper electrode layer 37 may constitute a phase changeable structure layer 38.

Figure 2D:
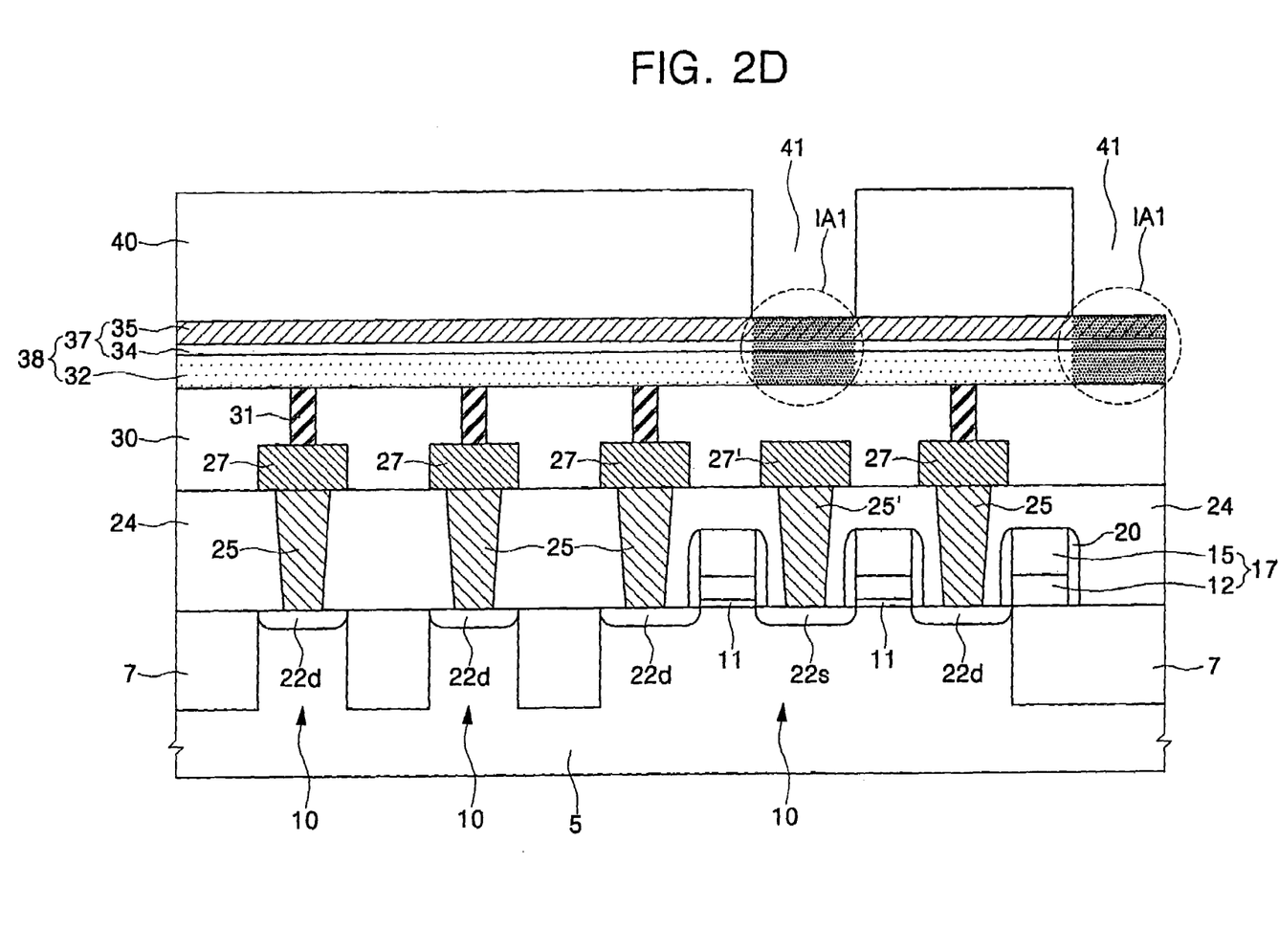

The method for forming the phase changeable memory cell array further includes the use of impurity ions. Specifically, the impurity ions are used to prevent the properties of the phase changeable material from altering because of thermal disturbances. The impurity ions may be added to the semiconductor substrate using an ion implantation process. Referring to FIGS. 1 and 2D, a first mask pattern 40 having line-shaped openings 41 may be formed on the semiconductor substrate 5 that includes the phase changeable structure layer 38. In an exemplary embodiment, the openings 41 formed in the first mask pattern 40 may be formed parallel to the word lines 17. Accordingly, the openings 41 formed in the first mask pattern 40 may be formed to cross over the active regions 10 and expose the phase changeable structure layer 38 over the common source regions 22s.

Impurity ions may be implanted into the semiconductor substrate 5 having the first mask pattern 40, thereby forming line-shaped impurity-implanted regions IA1 in the phase changeable structure layer 38. As mentioned above, the impurity ions may be implanted by an ion implantation process. In addition, the impurity ions may be selected from the group consisting of Ar, He, $N_2$, B, P, and As.

Figure 2E:
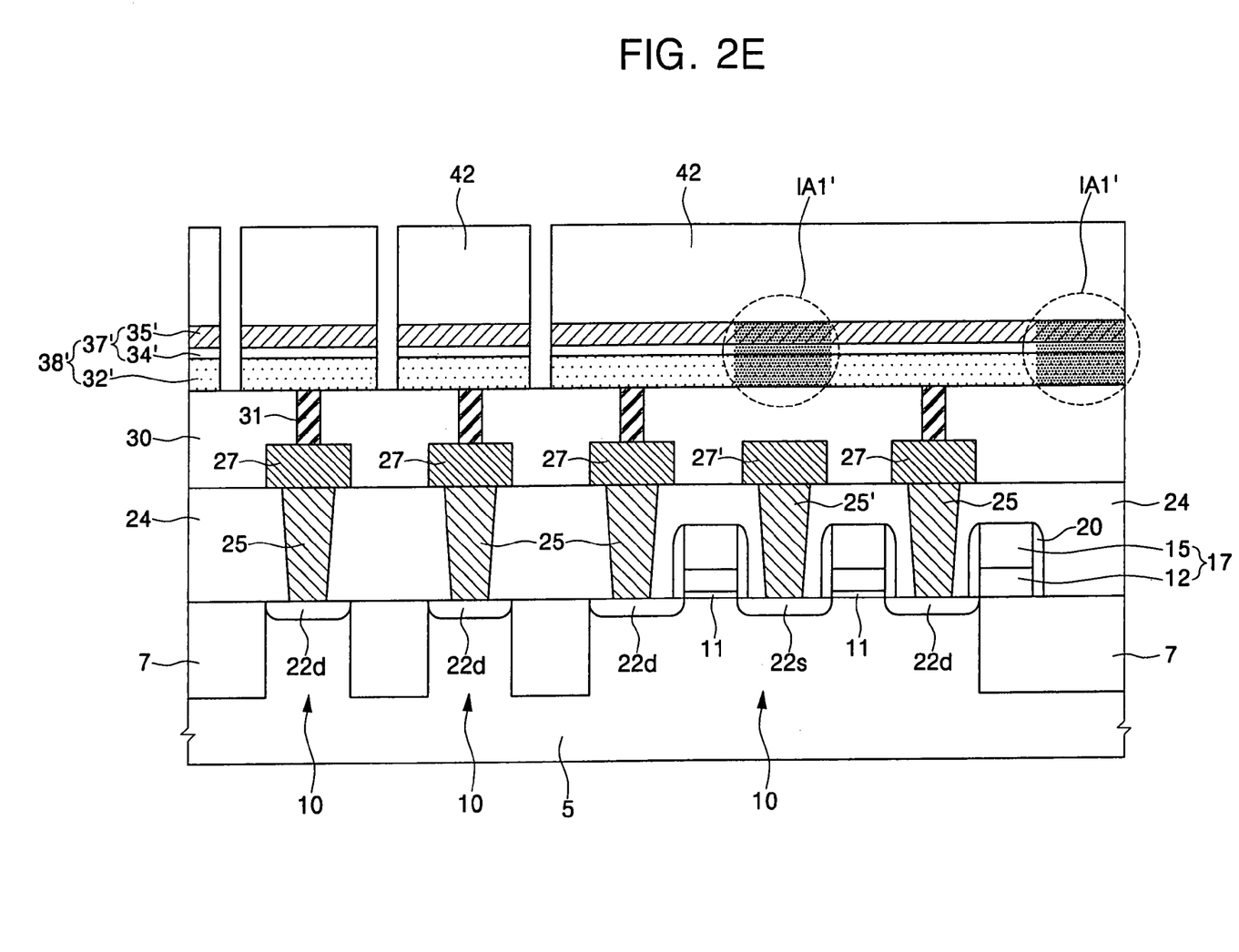

Referring to FIGS. 1 and 2E, the first mask pattern 40 is removed to expose the phase changeable structure layer 38. A second mask pattern 42 is then formed to cross the impurity-implanted regions IA1 on the semiconductor substrate 5 that includes the impurity-implanted regions IA1. Furthermore, the phase changeable structure layer 38 may be etched using the second mask pattern 42 as an etch mask, thereby forming phase changeable structure patterns 38'. In an exemplary embodiment, the impurity-implanted regions IA1 may be etched to form final impurity-implanted regions IA1'. Thereafter, the second mask pattern 42 is removed. The phase changeable structure patterns 38' may be divided into a plurality of second regions implanted with impurity ions (i.e., the final impurity-implanted regions IA1') and a plurality of first regions disposed between the second regions.

The phase changeable structure patterns 38' may be formed to cover the drain regions 22d and the common source regions 22s. Furthermore, the phase changeable structure patterns 38' may be formed across the word lines 17. In addition, each of the phase changeable structure patterns 38' may include a phase changeable material pattern 32' and an upper electrode 37', which are stacked sequentially. In addition, the upper electrode 37' may include an interface layer pattern 34' and a metal nitride layer pattern 35', which are also stacked sequentially.

The final impurity-implanted regions IA1' may include impurity ions with a concentration of 5% or more. The presence of the impurity ions may affect the physical state of the phase changeable material pattern 32'. In addition, the physical state of the phase changeable material pattern 32' may determine the thermal conductivity of phase changeable material pattern 32'. For example, the impurity ions change the phase changeable material pattern 32' of the final impurity-implanted regions IA1' into an amorphous state. Furthermore, the thermal conductivity of the phase changeable material pattern 32' depends on whether the phase changeable material pattern 32' is in a crystalline state or an amorphous state. For example, when the phase changeable material pattern 32' is a GST layer, the GST layer has a thermal conductivity of 0.005 J/cmKs in the crystalline state but has a thermal conductivity of 0.0017 J/cmKs in the amorphous state. That is, the crystalline GST layer is about three times as thermally conductive as the amorphous GST layer.

Accordingly, the final impurity-implanted regions IA1' have a lower thermal conductivity than an impurity unimplanted region of the phase changeable material pattern 32'. Because of having a lower thermal conductivity than the impurity unimplanted region, the final impurity-implanted regions IA1' serve as isolation regions. The use of these isolation regions allows the phase changeable material pattern 32' to be divided into several regions without a patterning process.

The low thermal conductivity of the isolation regions formed may be used to prevent the properties of the phase changeable material pattern 32' from deteriorating due to etching damage. That is, while permitting the semiconductor devices to be highly integrated, thermal disturbance between adjacent memory cells may be prevented by the final impurity-implanted regions IA1'.

Figure 2F:
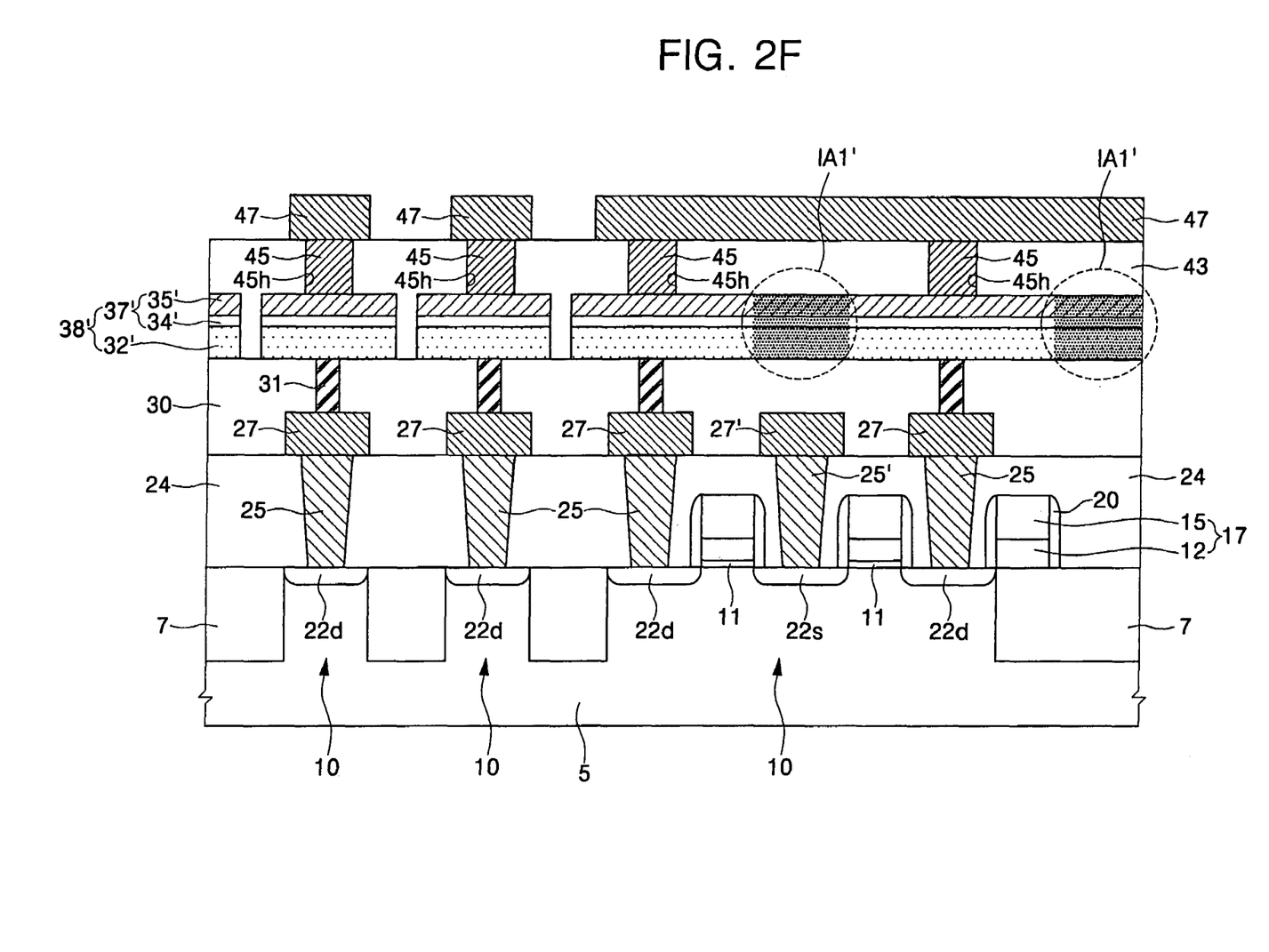

In addition to having final impurity-implanted regions IA1' serving as isolation regions, the phase changeable memory cell array also includes an upper interlayer insulating layer 43. Referring to FIGS. 1 and 2F, the upper interlayer insulating layer 43 is formed on the semiconductor substrate 5 that includes the phase changeable structure patterns 38'. In an exemplary embodiment, the upper interlayer insulating layer 43 may be formed of silicon oxide. In addition, the upper interlayer insulating layer 43 is patterned, thereby forming upper electrode contact holes 45h. The upper electrode contact holes 45h expose the corresponding first regions of the phase changeable structure patterns 38'.

The method for forming a phase changeable memory cell array also includes forming a conductive layer on the upper interlayer insulating layer 43. In particular, a conductive layer may be formed on the semiconductor substrate 5 that includes the upper electrode contact holes 45h. This conductive layer is then etched back or planarized until a top surface of the upper interlayer insulating layer 43 is exposed. As a result, upper electrode plugs 45 are formed in their corresponding upper electrode contact holes 45h. The upper electrode plugs 45 may be formed of various materials. For example, the upper electrode plugs 45 may be formed of a tungsten layer. In addition, before the conductive layer for forming the upper electrode plugs 45 is deposited, insulating contact spacers may be formed on sidewalls of the upper electrode contact holes 45h. The insulating contact spacers may be formed of materials such as, for example, a silicon nitride layer, or a silicon oxynitride layer.

In addition to the conductive layer that forms on the upper insulating layer 43, another conductive layer is formed on the upper electrode plugs 45. Furthermore, the other conductive layer is patterned across the word lines 17, thereby forming second interconnections 47. The second interconnections 47 are electrically connected to the upper electrode plugs 45. In addition, the second interconnections 47 may function as bit lines 47.

In another exemplary embodiment, the process of forming the upper electrode plugs 45 may be omitted. In this case, the second interconnections 47 may be in direct contact with the first regions of the phase changeable structure patterns 38' through the upper electrode contact holes 45h.

Figure 3:
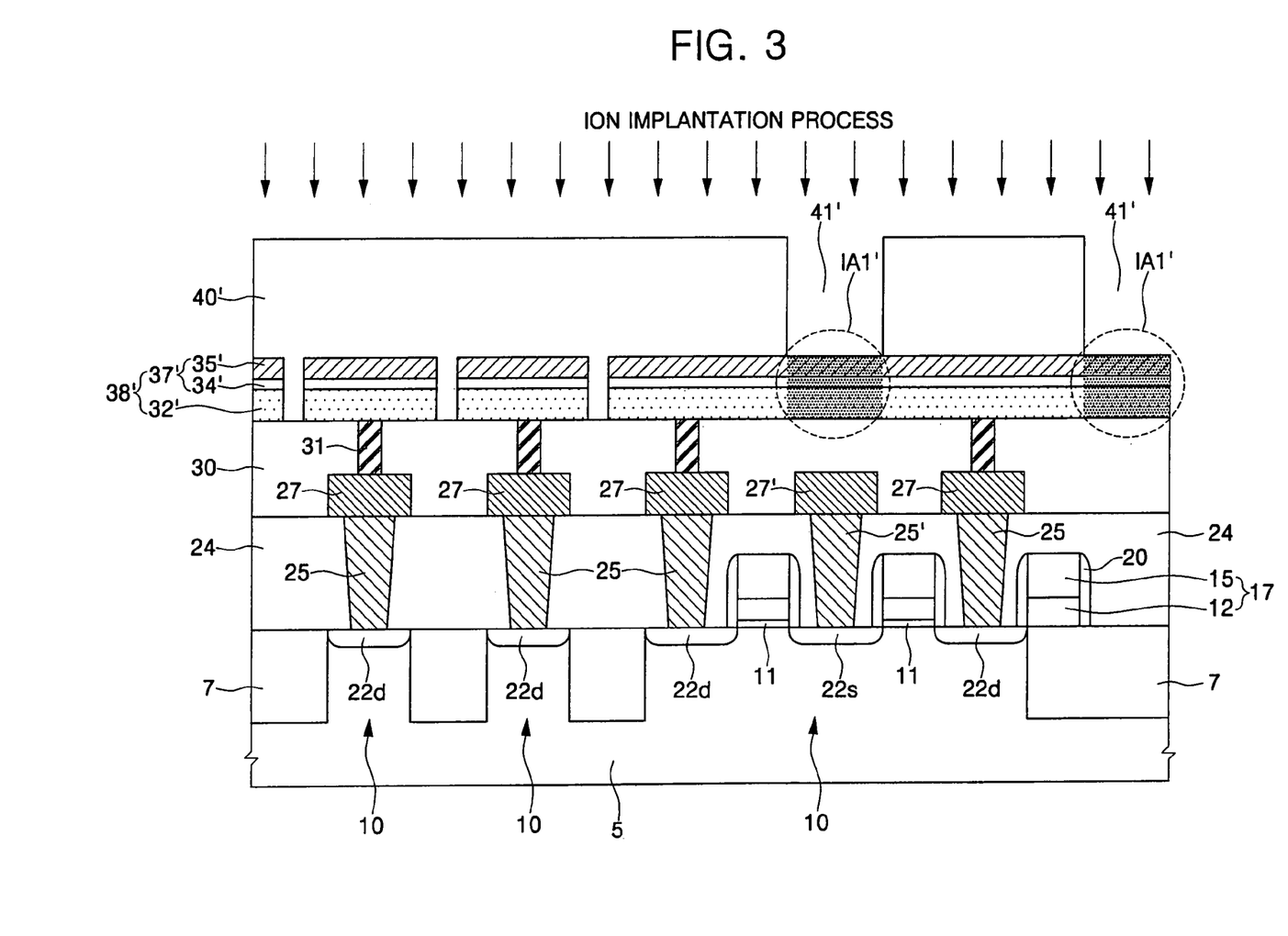
FIG. 3 is a vertical cross-sectional view taken along line I-I' of FIG. 1, illustrating a method of forming a phase changeable memory cell array region according to another exemplary disclosed embodiment.

FIG. 3 is a vertical cross-sectional view taken along line I-I' of FIG. 1, illustrating a method of forming a phase changeable memory cell array region according to another exemplary embodiment of the present invention.

Referring to FIGS. 1 and 3, a phase changeable structure layer 38 is formed by the same method as that described with reference to FIGS. 2A through 2C. Thereafter, the phase changeable structure layer 38 is selectively patterned, to form line-shaped phase changeable structure patterns 38' across the word lines 17. Specifically, the phase changeable structure patterns 38' may be formed to cover the drain regions 22d and the common source regions 22s. Furthermore, each of the phase changeable structure patterns 38' may include a phase changeable material pattern 32' and an upper electrode 37', which are sequentially stacked. In addition, the upper electrode 37' may include an interface layer pattern 34' and a metal nitride layer pattern 35', which are sequentially stacked.

Thereafter, a mask pattern 40' including line-shaped openings 41' may be formed across the phase changeable structure patterns 38'. In this case, the line-shaped openings 41' are formed to expose the phase changeable structure patterns 38' over the common source regions 22s. Furthermore, the line-shaped openings 41' may be formed parallel to the word lines 17. Because the line-shaped openings 41' are formed across the phase changeable structure patterns 38', the line-shaped openings 41' may expose sidewalls of the phase changeable structure patterns 38'.

In addition to forming the openings, impurity ions may be implanted into the semiconductor substrate 5 that now includes the mask pattern 40'. By implanting the impurity ions into the semiconductor substrate 5, final impurity-implanted regions IA1' in the phase changeable structure patterns 38' are formed. In an exemplary embodiment, the impurity ions may be implanted by an ion implantation process. Furthermore, the impurity ions may be at least one selected from the group consisting of Ar, He, $N_2$, B, P, and As. Also, the impurity ions may be implanted by an oblique ion implantation process. In this case, the impurity ions may be implanted into the sidewalls of the phase changeable structure patterns 38' that are exposed by the openings 41', so that the impurity ions may be uniformly implanted into the phase changeable structure patterns 38'.

The final impurity-implanted regions IA1' may include impurity ions with a concentration of 5% or more. The impurity ions may change the physical state of the phase changeable material pattern 32'. For example, the impurity ions change the phase changeable material pattern 32' of the final impurity-implanted regions IA1' into an amorphous state. The thermal conductivity of the phase changeable material pattern 32' depends on whether the phase changeable material pattern 32' is in a crystalline state or an amorphous state. For example, when the phase changeable material pattern 32' is a GST layer, the GST layer has a thermal conductivity of 0.005 J/cmKs in the crystalline state. However, the GST layer has a thermal conductivity of 0.0017 J/cmKs in the amorphous state. That is, the crystalline GST layer is about three times as thermally conductive as the amorphous GST layer.

Accordingly, the final impurity-implanted regions IA1' have a lower thermal conductivity than an impurity unimplanted region of the phase changeable material pattern 32'. Because of having a lower thermal conductivity than the impurity unimplanted region, the final impurity-implanted regions IA1' serve as isolation regions. The use of these isolation regions allows the phase changeable material pattern 32' to be divided into several regions without a patterning process.

The low thermal conductivity of the isolation regions formed may be used to prevent the properties of the phase changeable material pattern 32' from deteriorating due to etching damage. That is, while permitting the semiconductor devices to be highly integrated, thermal disturbance between adjacent memory cells may be prevented by the final impurity-implanted regions IA1'.

Subsequently, the mask pattern 40' is removed, and the same process as described with reference to FIG. 2F is carried out, thereby completing a phase changeable memory cell array region.

Figure 4A:
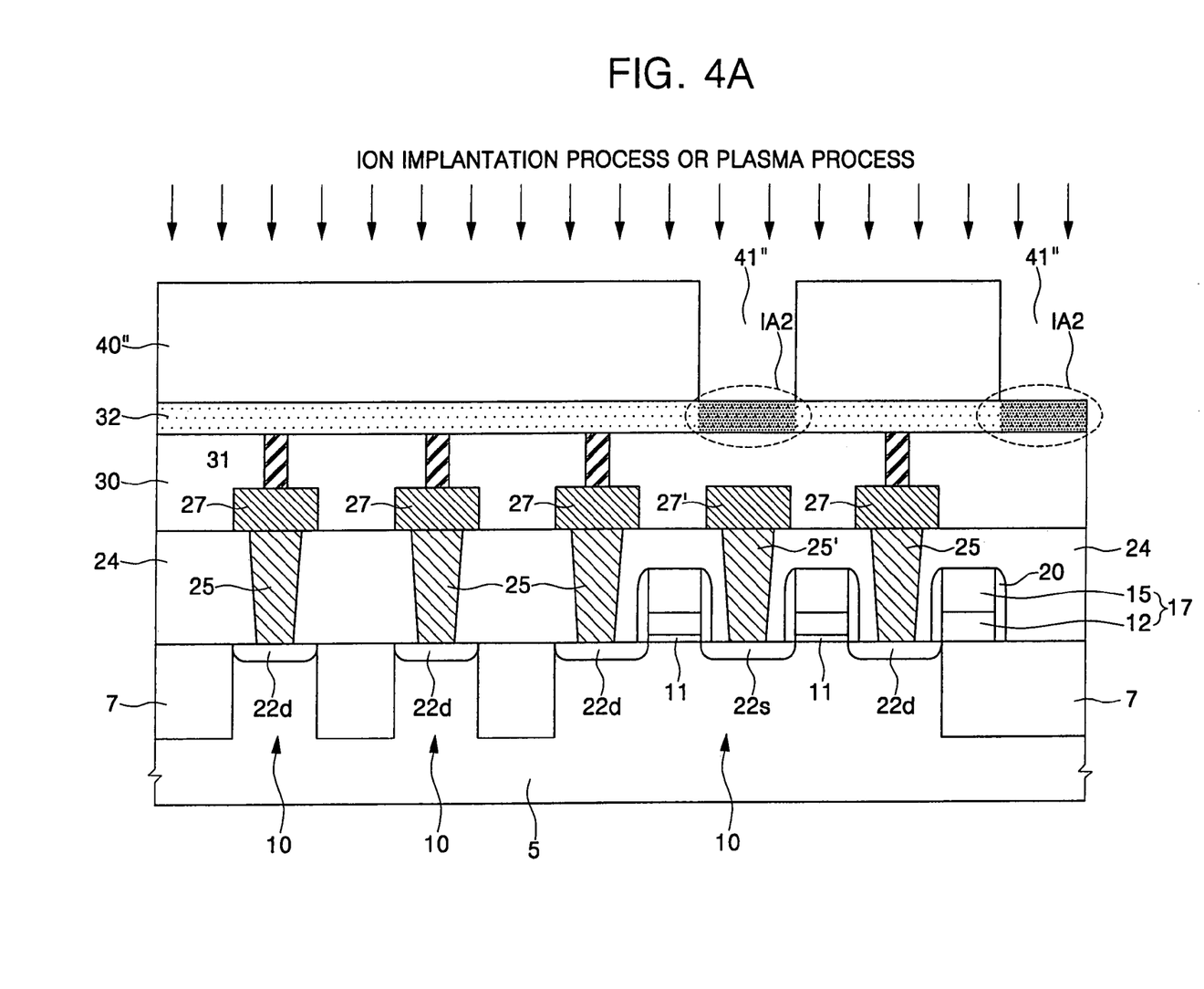
FIGS. 4A and 4B are vertical cross-sectional views taken along line I-I' of FIG. 1, illustrating a method of forming a phase changeable memory cell array region according to yet another exemplary embodiment.
Figure 4B:
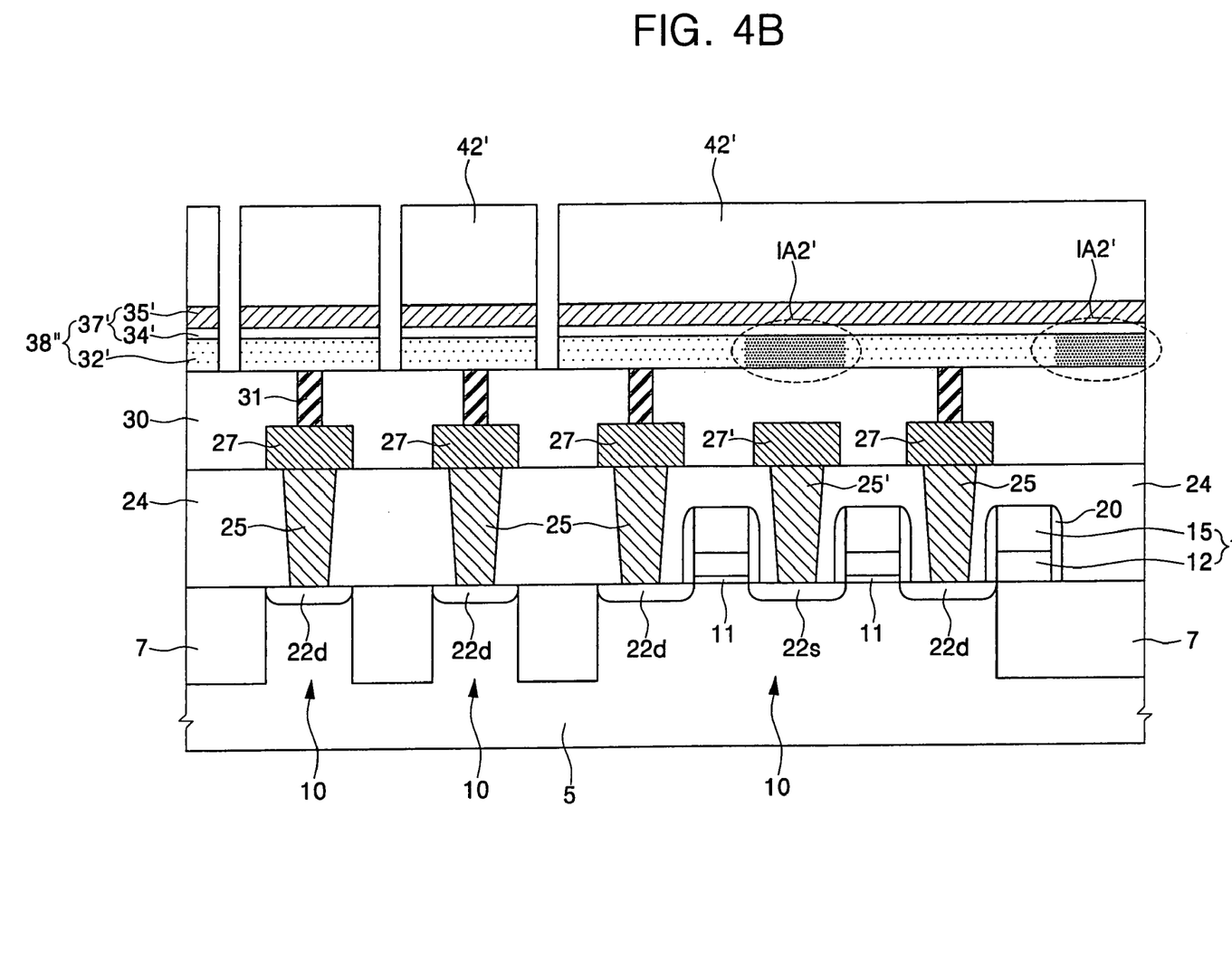

FIGS. 4A and 4B are vertical cross-sectional views taken along line I-I' of FIG. 1, illustrating a method of forming a phase changeable memory cell array region according to yet another exemplary embodiment of the present invention.

Referring to FIGS. 1 and 4A, a phase changeable material layer 32 is formed by the same method as that described with reference to FIGS. 2A through 2C. Subsequently, a first mask pattern 40" having line-shaped openings 41" may be formed on the semiconductor substrate 5 including the phase changeable material layer 32. In this case, the openings 41" formed in the first mask pattern 40" may be formed parallel to the word lines 17. Thus, the openings 41" formed in the first mask pattern 40" may be formed to cross over the active regions 10 and expose the phase changeable material layer 32 over the common source regions 22s.

Impurity ions may be implanted into the semiconductor substrate 5 including the first mask pattern 40" to form line-shaped impurity-implanted regions IA2 in the phase changeable material layer 32. In an exemplary embodiment, the impurity ions may be implanted by an ion implantation process. The impurity ions may be at least one selected from the group consisting of Ar, He, $N_2$, B, P, and As. Alternatively, the impurity ions may be implanted by a plasma process. In this case, the plasma process may be carried out using at least one plasma processing gas selected from the group consisting of Ar gas, He gas, and $N_2$ gas.

Referring to FIGS. 1 and 4B, the first mask pattern 40" is removed to expose the phase changeable material layer 32 including the impurity-implanted regions IA2. Thereafter, an upper electrode layer may be formed on the semiconductor substrate 5 having the phase changeable material layer 32. Specifically, the upper electrode layer may be formed by sequentially stacking an interface layer and a metal nitride layer. For example, the upper electrode layer may be formed by sequentially stacking a Ti layer and a TiN layer. The phase changeable material layer 32 and the upper electrode layer may constitute a phase changeable structure layer.

In addition to the forming the phase changeable structure layer, a second mask pattern 42' is formed on the semiconductor substrate 5 that includes the phase changeable structure layer. The second mask pattern 42 is formed across the impurity-implanted regions IA2. Furthermore, the phase changeable structure layer may be etched using the second mask pattern 42' as an etch mask to form phase changeable structure patterns 38". In this case, the impurity-implanted regions IA2 may be etched to form final impurity-implanted regions IA2'. Thereafter, the second mask pattern 42' is removed. Each of the phase changeable structure patterns 38" may include a phase changeable material pattern 32' and an upper electrode 37', which are sequentially stacked. Also, the upper electrode 37' may include an interface layer pattern 34' and a metal nitride layer pattern 35', which are sequentially stacked.

The phase changeable structure patterns 38" may be formed to cover the drain regions 22d and the common source regions 22s. In addition, the phase changeable structure patterns 38" may be formed across the word lines 17. Unlike the previous embodiments, the final impurity-implanted regions IA2' in the exemplar embodiment are formed only in the phase changeable material patterns 32' of the phase changeable structure patterns 38". The phase changeable material patterns 32' may be divided into second regions implanted with impurity ions (i.e., the final impurity-implanted regions IA2') and first regions disposed between the second regions.

The final impurity-implanted regions IA2' may contain impurity ions with a concentration of 5% or more. The impurity ions may change the physical state of the phase changeable material pattern 32'. For example, the impurity ions change the phase changeable material pattern 32' of the final impurity-implanted regions IA2' into an amorphous state. The thermal conductivity of the phase changeable material pattern 32' depends on whether the phase changeable material pattern 32' is in a crystalline state or an amorphous state. For example, when the phase changeable material pattern 32' is a GST layer, the GST layer has a thermal conductivity of 0.005 J/cmKs in the crystalline state. However, the GST layer has a thermal conductivity of 0.0017 J/cmKs in the amorphous state. That is, the crystalline GST layer is about three times as thermally conductive as the amorphous GST layer.

Accordingly, the final impurity-implanted regions IA2' have a lower thermal conductivity than an impurity unimplanted region of the phase changeable material pattern 32'. Because of having a lower thermal conductivity than the impurity unimplanted region, the final impurity-implanted regions IA2' serve as isolation regions. The use of these isolation regions allows the phase changeable material pattern 32' may be divided into several regions without a patterning process.

The low thermal conductivity of the isolation regions formed may be used to prevent the properties of the phase changeable material pattern 32' from deteriorating due to etching damage. That is, while permitting the semiconductor devices to be highly integrated, thermal disturbance between adjacent memory cells may be prevented by the final impurity-implanted regions IA2'. Subsequently, the same process as described with reference to FIG. 2F is carried out, thereby completing a phase changeable memory cell array region.

As described in the disclosure above, in a phase changeable memory cell array region, amorphous impurity-implanted regions are formed in the phase changeable material layer by doping impurity ions. The thermal conductivity of these amorphous impurity-implanted regions is about $1/3^{rd}$ that of crystalline regions. Accordingly, the impurity-implanted regions may serve as isolation regions of the phase changeable material layer. These isolation regions may prevent thermal disturbances from occurring between the adjacent memory cells. As a result, the phase changeable memory cell array region may be used in the fabrication of highly integrated semiconductor devices.

Exemplary embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A phase changeable memory cell array region, comprising:
   a plurality of conductive plugs disposed on a semiconductor substrate;
   at least one phase changeable structure pattern formed over the conductive plugs, the phase changeable structure pattern comprising a phase changeable material pattern and an upper electrode on the phase changeable material pattern;

an upper insulating layer covering the phase changeable material pattern; and a conductive pattern disposed on the upper insulating layer and electrically connected to the upper electrode, wherein the phase changeable structure pattern comprises implanted regions adjacent to non-implanted regions, wherein each of the implanted regions includes an implanted phase changeable material pattern and an implanted upper electrode.

2. The phase changeable memory cell array region according to claim 1, wherein the upper electrode comprises:

an interface layer on the phase changeable material pattern; and a metal nitride layer on the interface layer.

3. The phase changeable memory cell array region according to claim 1, wherein the implanted upper electrode is self-aligned with the implanted phase changeable material pattern.

* * * * *